United States Patent
Kotiya et al.

(10) Patent No.: US 10,750,299 B2
(45) Date of Patent: Aug. 18, 2020

(54) PIEZOELECTRIC INERTIAL ACTUATOR

(71) Applicant: Dalhousie University, Halifax (CA)

(72) Inventors: Akhelish Kotiya, Halifax (CA); Robert B. A. Adamson, Halifax (CA); Manohar Bance, Halifax (CA); Jeremy A. Brown, Halifax (CA)

(73) Assignee: DAXSONICS ULTRASOUND INC., Halifax (CA)

( * ) Notice: Subject to any disclaimer, the term of this patent is extended or adjusted under 35 U.S.C. 154(b) by 0 days.

(21) Appl. No.: 16/104,686

(22) Filed: Aug. 17, 2018

(65) Prior Publication Data

US 2018/0359577 A1    Dec. 13, 2018

Related U.S. Application Data

(63) Continuation of application No. PCT/CA2017/050201, filed on Feb. 16, 2017.

(60) Provisional application No. 62/296,551, filed on Feb. 17, 2016.

(51) Int. Cl.
| | | |
|---|---|---|
| H04R 25/00 | (2006.01) | |
| H04R 17/10 | (2006.01) | |
| H01L 41/09 | (2006.01) | |
| H01L 41/187 | (2006.01) | |

(52) U.S. Cl.
CPC ........... *H04R 25/606* (2013.01); *H04R 17/10* (2013.01); *H01L 41/0973* (2013.01); *H01L 41/1875* (2013.01); *H01L 41/1876* (2013.01); *H04R 2225/67* (2013.01); *H04R 2460/13* (2013.01)

(58) Field of Classification Search
CPC ...... H04R 25/606; H04R 17/10; H04R 17/00; H04R 2460/13; H04R 25/00; H04R 25/70; H04R 17/005; H04R 17/02; H04R 1/10; H04R 1/105; H04R 1/1066; H04R 1/1091; H04R 1/24; H04R 1/46; B06B 1/0603; B06B 1/0644; B06B 1/0688
USPC ....... 381/326, 312, 380; 600/587, 25; 607/3; 623/17.16, 17.11, 17.12; 361/789, 804
See application file for complete search history.

(56) References Cited

U.S. PATENT DOCUMENTS

| | | | |
|---|---|---|---|
| 4,596,903 A * | 6/1986 | Yoshizawa | G01H 11/08 367/166 |
| 5,772,575 A | 6/1998 | Lesinski et al. | |
| 7,618,450 B2 | 11/2009 | Zarowski et al. | |
| 8,150,083 B2 | 4/2012 | Parker et al. | |
| 8,170,252 B2 | 5/2012 | Parker et al. | |
| 8,864,645 B2 | 10/2014 | Abel et al. | |
| 8,977,329 B1 * | 3/2015 | Arao | H04M 1/0266 455/575.8 |

(Continued)

FOREIGN PATENT DOCUMENTS

| | | | |
|---|---|---|---|
| EP | 1020937 A1 * | 7/2000 | H01L 41/0946 |
| EP | 2440166 B1 * | 12/2016 | H04R 25/606 |

*Primary Examiner* — Fan S Tsang
*Assistant Examiner* — Julie X Dang
(74) *Attorney, Agent, or Firm* — Ryan W. Dupuis; Ade + Company Inc.; Kyle R. Satterthwaite

(57) ABSTRACT

Among other things, in general, a piezoelectric actuator for use in a piezoelectric inertial hearing aid is disclosed. The actuator includes at least one bimorph having a top piezoelectric plate, a bottom piezoelectric plate, and a shim with holed ends that extends beyond the length of the plates for securing to bone across, e.g., the mastoid cavity. Actuators having two or morph bimorphs and kits containing the same are also disclosed.

10 Claims, 9 Drawing Sheets

(56) References Cited

U.S. PATENT DOCUMENTS

| | | | |
|---|---|---|---|
| 9,107,013 B2 | 8/2015 | Andersson et al. | |
| 2003/0048915 A1* | 3/2003 | Bank | H04M 1/05 381/326 |
| 2004/0127900 A1* | 7/2004 | Konieczynski | A61B 17/8042 606/281 |
| 2005/0129257 A1* | 6/2005 | Tamura | H04R 17/00 381/151 |
| 2009/0245553 A1 | 10/2009 | Parker | |
| 2009/0247810 A1 | 10/2009 | Parker et al. | |
| 2010/0165794 A1* | 7/2010 | Takahashi | B06B 1/0603 367/189 |
| 2010/0298626 A1* | 11/2010 | Andersson | H04R 25/606 600/25 |
| 2013/0136279 A1* | 5/2013 | Brown | H04R 1/10 381/151 |
| 2016/0134977 A1* | 5/2016 | Inagaki | H04R 17/00 381/60 |
| 2019/0037322 A1* | 1/2019 | Santek | H04R 25/606 |

\* cited by examiner

PIEZOELECTRIC INERTIAL ACTUATOR

CROSS-REFERENCE TO RELATED APPLICATIONS

This application is a continuation of International PCT Application No. PCT/CA2017/050201, filed Feb. 16, 2017, which claims the benefit of U.S. Provisional Patent Ser. No. 62/296,551, filed Feb. 17, 2016, the contents of which are hereby incorporated by reference.

BACKGROUND

In the last decade a lot of effort has been put into the development of transcutaneous bone conduction implants for treating conductive hearing loss. These implants are aimed at addressing two main drawbacks of traditional percutaneous implants such as the Bone-Anchored Hearing Aid (BAHA) and the Ponto system: the need for regular care of the implant site, with increased risk of infection; and the cosmetic issues surrounding an implant sticking out of the head. The marketed transcutaneous implants are generally classified as active (Bonebridge, BCITM) or passive (Audiant, Sophono, BAHA Attract) depending upon the nature of actuation. Most of these implants (whether passive or active) transmit vibrations to skull bone through an inertial mechanism, i.e., the actuator has a vibrating mass that imparts an inertial force to the underlying skull bone.

Recently (Kotiya et al, Otol Neurotol 2016 July; 37(6): 753-760, hereby incorporated by reference) a piezoelectric actuator that imparts skull bone vibration via flexural bending of the skull was proposed and demonstrated (subcutaneous piezoelectrically actuated hearing aid: SPAHA). Comparison of the bending actuator with a commercial inertial actuator showed that the bending actuator has superior performance at higher frequencies (>1800 Hz). However, the bending actuator cannot match the performance of the inertial actuators at lower frequencies since inertial actuators are designed to have resonance frequency at 700 Hz. Lacking an inertial mass, the SPAHA does not have a resonance and so has difficulty achieving large response at low frequencies.

There remains a need for a piezoelectric inertial actuator that can improve low frequency performance while maintaining superior high frequency performance in hearing aid applications.

SUMMARY

In general, in an aspect, a piezoelectric actuator is disclosed, capable of being secured to bone using surgical screws, the actuator having a first layer piezoelectric bimorph, the first bimorph having a first top piezoelectric plate, a first bottom piezoelectric plate, and a first bimorph shim interposed between and approximately centered within the first piezoelectric plates, wherein the first shim has a length longer than that of the first piezoelectric plates such that first ends are formed, wherein the first ends have first holes suitable for inserting surgical screws therein. Implementations may include one or more of the following. The actuator also has a second layer piezoelectric bimorph, the second bimorph having a second top piezoelectric plate, a second bottom piezoelectric plate, and a second bimorph shim interposed between and approximately centered within the second piezoelectric plates, wherein the second shim has a length longer than that of the second piezoelectric plates such that second ends are formed, wherein the second ends have first holes suitable for inserting surgical screws therein; and a spacer between the first bimorph and the second bimorph. The actuator also has a center mass attached to the first bimorph. The first resonance frequency of the first layer is between about 400 and about 1000 Hz. The first resonance frequency of the first layer is between about 400 and about 1000 Hz and the first resonance frequency of the second layer is above 1000 Hz. The piezoelectric plates are composed of PZT 5H. The piezoelectric plates are composed of PMN-PT. The shim(s) do not exceed about 50 mm in length. The shim(s) do not exceed about 20 mm in width. The piezoelectric actuator is used in a piezoelectric inertial hearing aid.

In general, in an aspect, a kit is disclosed comprising a piezoelectric inertial hearing having a piezoelectric actuator as described above, and a set of surgical screws, each screw of a length long enough to reach through a preselected first end hole, each spacer if present, each corresponding second end hole if present, and into bone.

These and other features and aspects, and combinations of them, may be expressed as methods, systems, components, means and steps for performing functions, apparatus, articles of manufacture, compositions of matter, and in other ways.

DESCRIPTION

Figure 1:
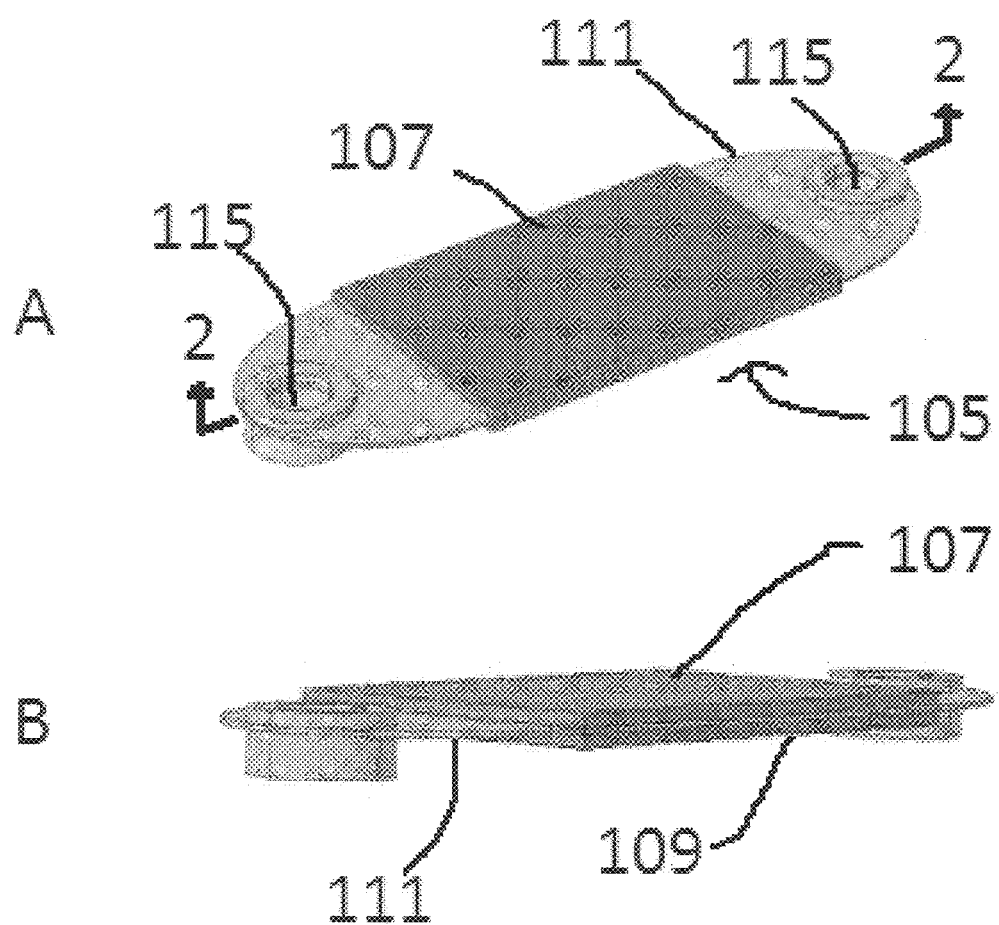
FIG. 1 shows perspective views A, B of a single-level actuator design of the present disclosure.

FIGS. 8A-8E show respective photographs A, B, C, D, E of example actuators of the present disclosure with electrical connections and as installed into cadavers. Photographs C-E show a PIHA implanted over a mastoid cavity. A BAHA is implanted at its standard location of 55 mm from the ear canal. The ear canal itself is drilled out so as to enable measurement of promontory vibration velocity using a laser Doppler vibrometer, as generally described in the Examples.

PARTS LEGEND

101 Skull bone
103 Mastoid cavity

105 Single-level piezoelectric actuator
107 First top piezoelectric plate
109 First bottom piezoelectric plate
111 First shim
113 Surgical screws inserted into first end holes
115 First end holes
205 Multi-level piezoelectric actuator
207 Second top piezoelectric plate
209 Second bottom piezoelectric plate
211 Second shim
213 Second end holes
215 Spacer According to one aspect of the disclosure, a piezoelectric inertial hearing aid (PIHA) for bone conduction hearing is disclosed comprising either a single-level actuator or a multi-level actuator as described below. In some embodiments, the actuator and electrical connections thereto are held within a hermetically sealed biocompatible housing. In some embodiments, electrical connections internally connect the actuator to electrical feedthrough terminals within the housing, where the feedthrough terminals obtrude from the housing such that further electrical connections between the actuator and elements external to the housing can be made using the terminals. In some embodiments, the housing is titanium. In some embodiments, the housing is a biocompatible polymer. In some embodiments, the housing is silicone.

Figure 2:
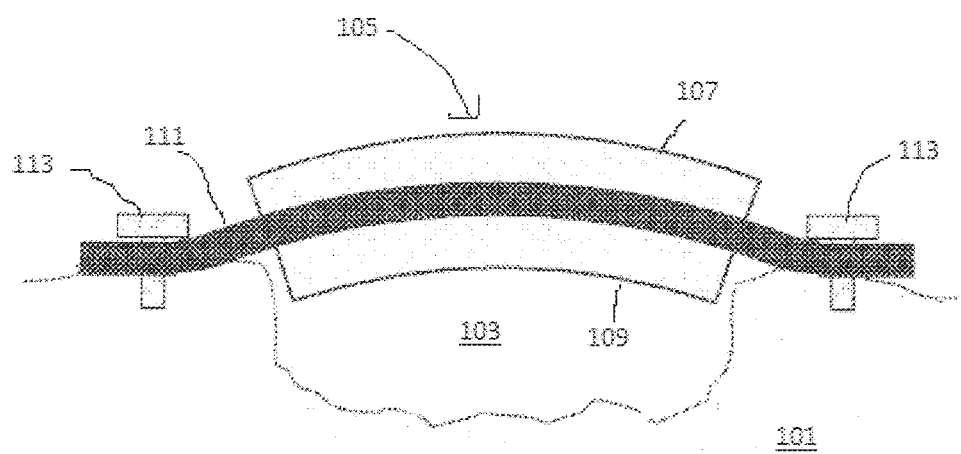
FIG. 2 shows a sectional view of a single-level actuator design of the present disclosure, generally along line 2-2 of FIG. 1.
Figure 3:
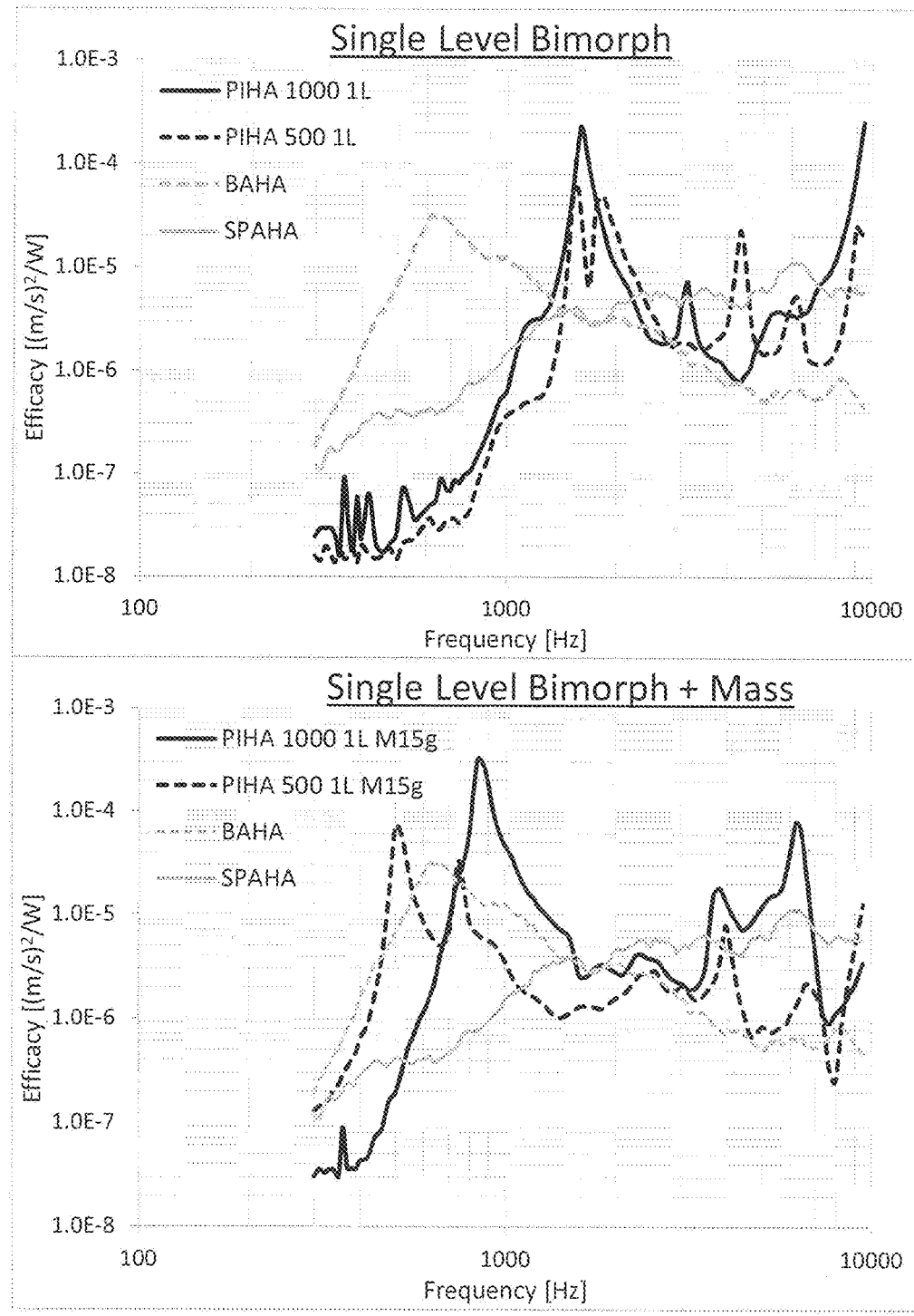
FIG. 3 shows efficacy measurement of example single-level actuators of the present disclosure, denoted PIHA 1000 1L and PIHA 500 1L for 1000 um and 500 um piezo plate thicknesses respectively, without (A) and with (B) a 15 g center mass attached and as compared to BAHA and SPAHA.
Figure 4:
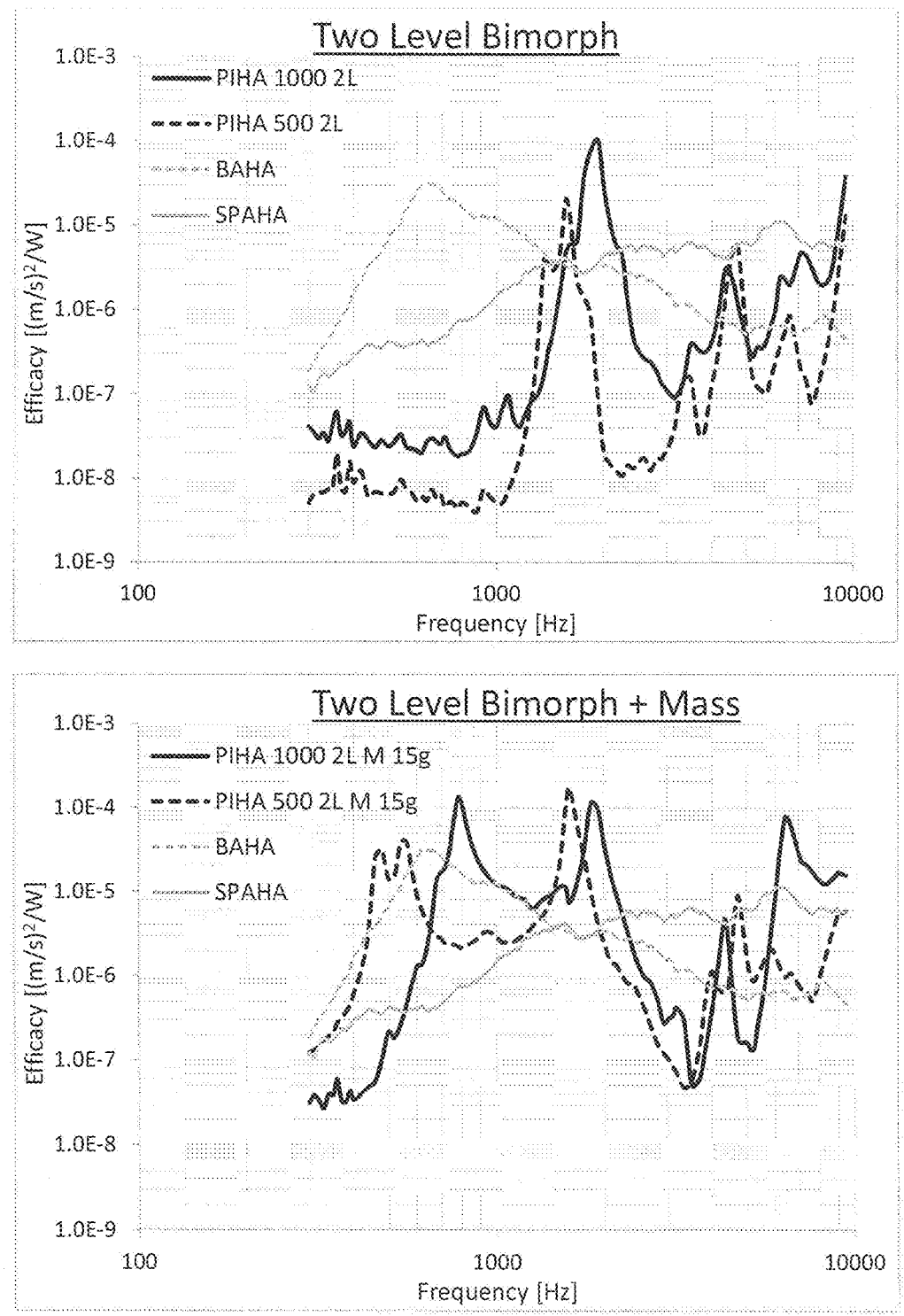
FIG. 4 shows efficacy measurement of example multi-level actuators of the present disclosure, denoted PIHA 1000 2L and PIHA 500 2L for 1000 um and 500 um piezo plate thicknesses respectively, each having two bimorphs without (A) and with (B) a 15 g center mass attached to the first layer bimorph and as compared to BAHA and SPAHA.
Figure 5:
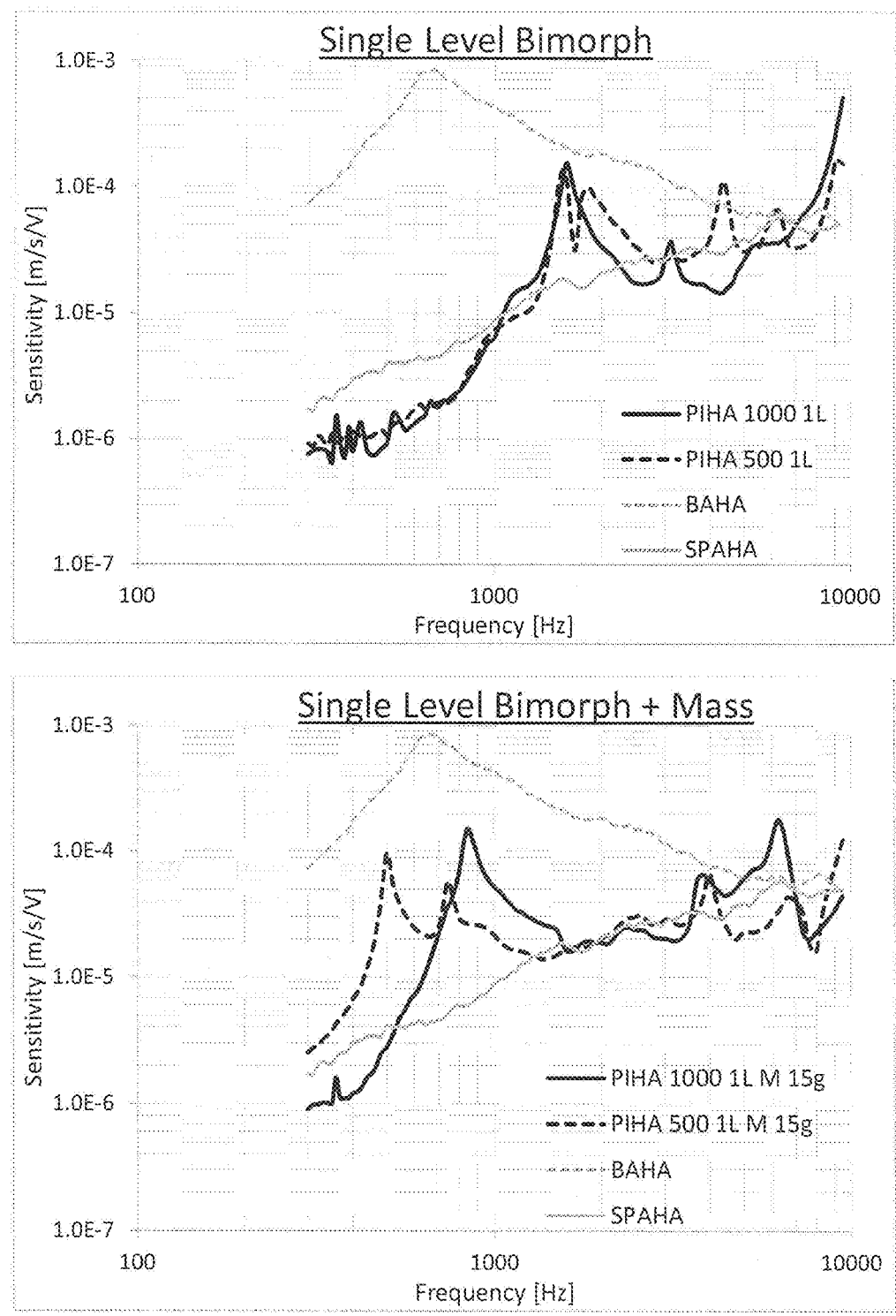
FIG. 5 shows sensitivity measurement of example single-level actuators of the present disclosure, denoted PIHA 1000 1L and PIHA 500 1L, without (A) and with (B) a 15 g center mass attached and as compared to BAHA and SPAHA.
Figure 6:
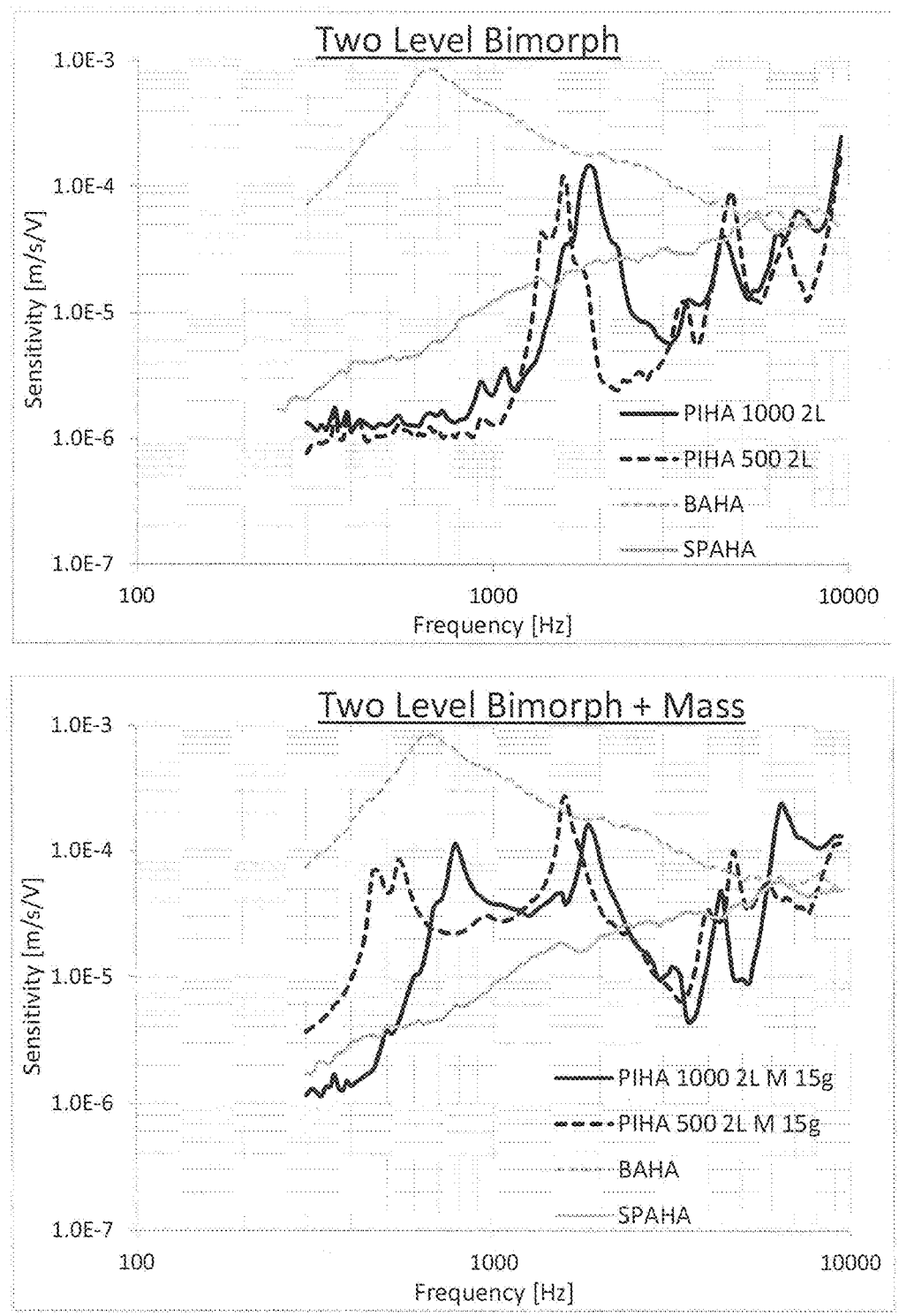
FIG. 6 shows sensitivity measurement of example multi-level actuators of the present disclosure, denoted PIHA 1000 2L and PIHA 500 2L, each having two bimorphs without (A) and with (B) a 15 g center mass attached to the first layer bimorph and as compared to BAHA and SPAHA.

According to one aspect of the disclosure, a single level piezoelectric actuator is disclosed. See FIGS. 1 and 2. A single level piezoelectric actuator has a piezoelectric bimorph 105 having a piezoelectric plate 107 at top, a piezoelectric plate 109 at bottom, and a shim 111; in some embodiments the piezoelectric plates are each less than or equal to about 500 um in thickness, less than or equal to about 30 mm in length, and less than or equal to about 20 mm in width. The bimorph shim 111 extends beyond the length of the top and bottom piezoelectric plates 107 and 109; in some embodiments the shim is less than or equal to about 250 um in thickness, less than or equal to about 50 mm in length, and less than or equal to about 20 mm in width. The shim has two ends, and both ends have a hole or holes drilled into them that aid in securing the actuator onto the skull bone. In some embodiments, the actuator is secured to the skull bone using titanium screws 113 screwed into the shim holes. In some embodiments, the first resonance frequency of the actuator is between about 400 Hz and about 1000 Hz. In some embodiments, the first resonance frequency is selected such that the frequency response of the actuator matches that of a bone-anchored hearing aid. In some embodiments, piezoelectric materials are electrically driven using electrical connections attached to the plates; see, e.g., FIG. 8A.

Figure 7:
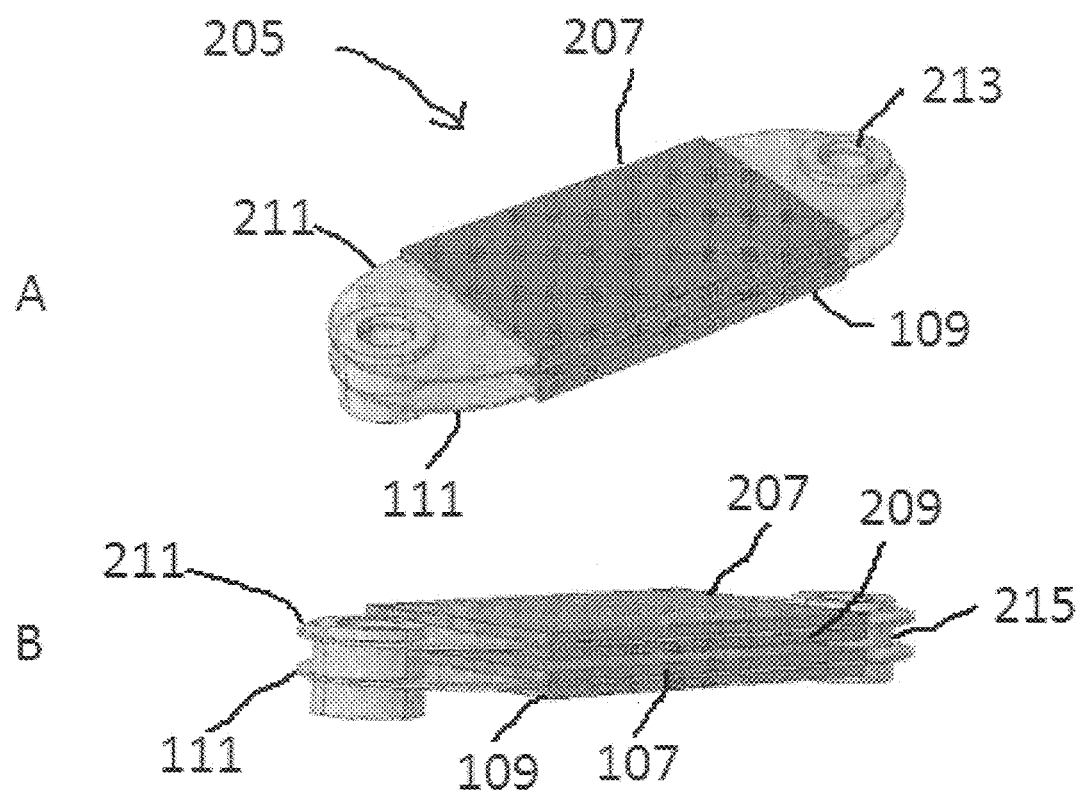
FIG. 7 shows perspective views A,B of a multi-level actuator design of the present disclosure.
Figure 8A:
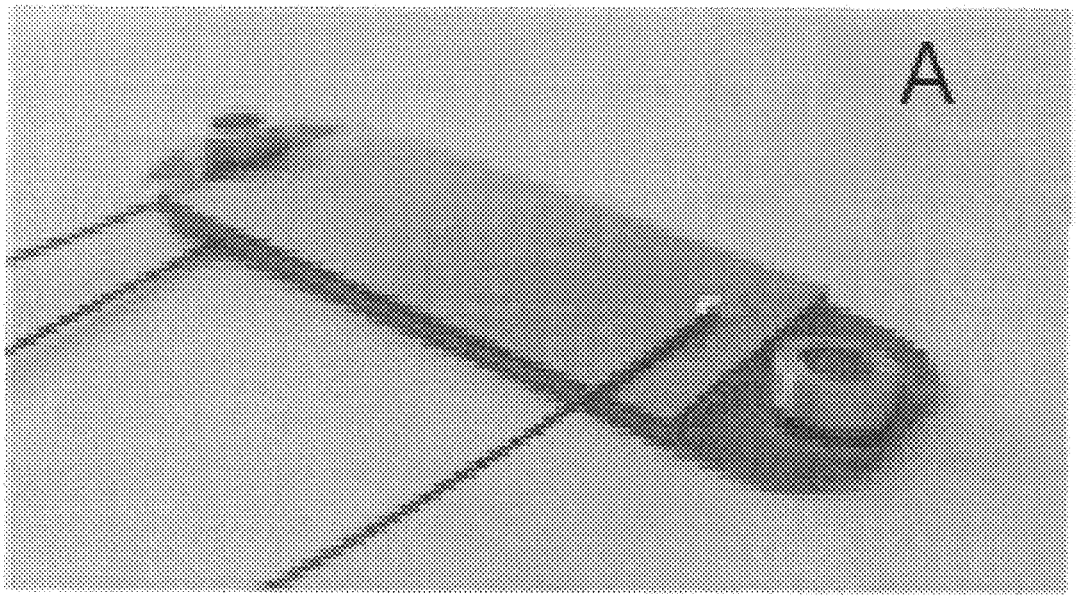
Figure 8B:
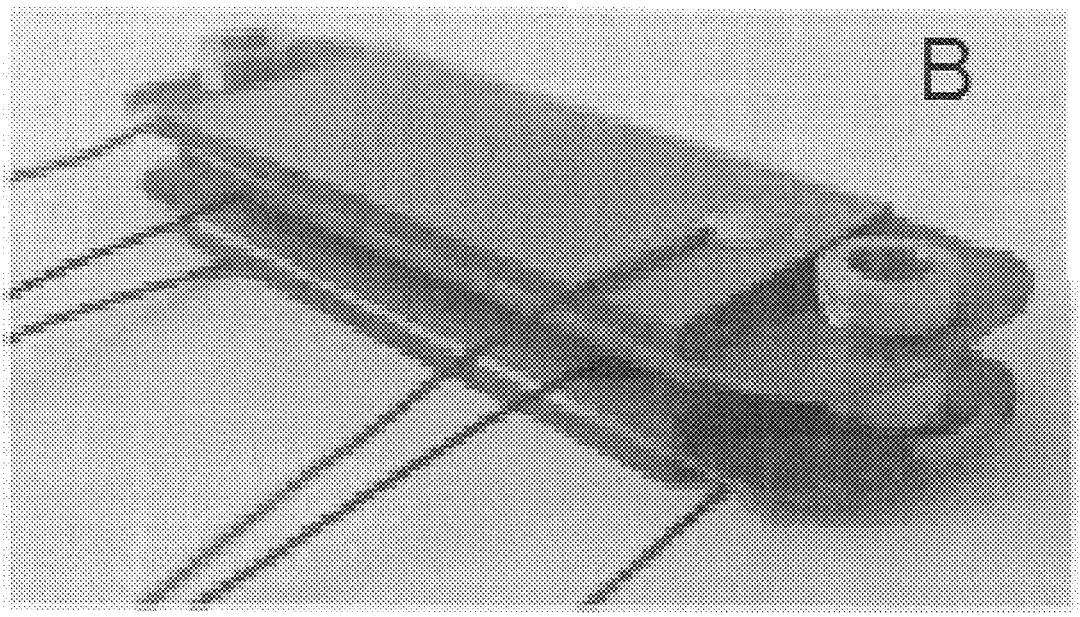
Figure 8C:
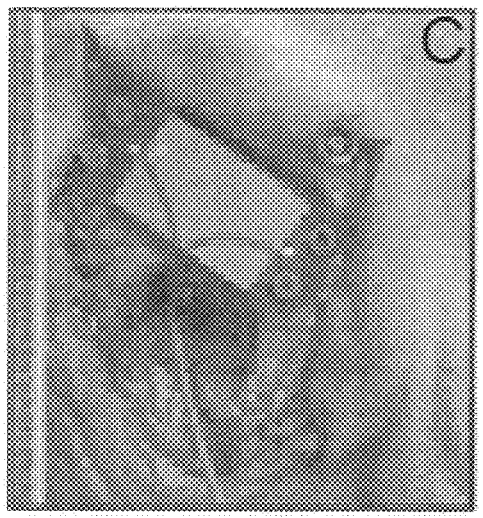
Figure 8D:
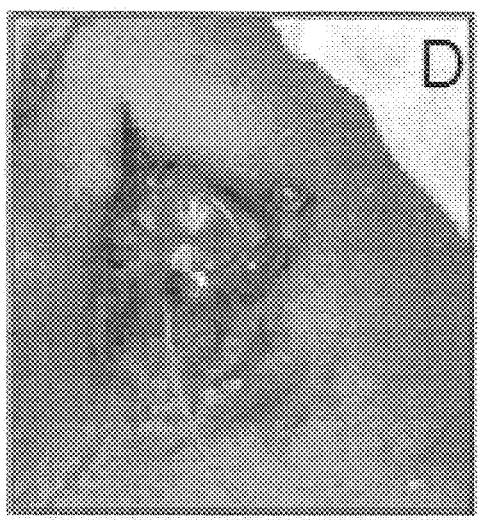
Figure 8E:
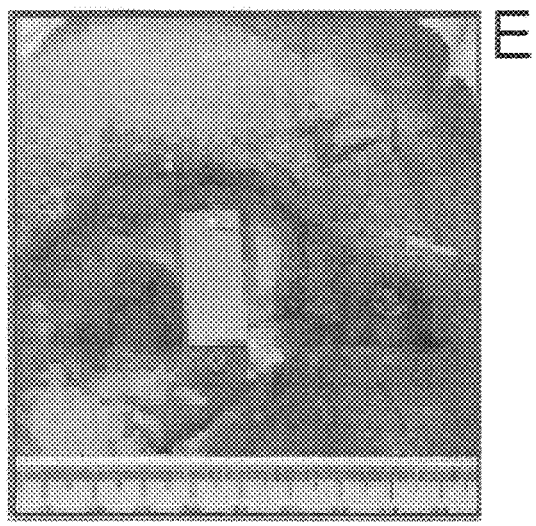

According to one aspect of the disclosure, a multi-level piezoelectric actuator is disclosed. See FIG. 7. A multi-level piezoelectric actuator 205 comprises two or more single-level piezoelectric actuators separated by spacers 215, each having a piezoelectric plate (first layer 107, second layer 207) at top, a corresponding piezoelectric plate (first layer 109, second layer 209) at bottom, and a corresponding shim (first layer 111, second layer 211); in some embodiments each set of piezoelectric plates is less than about 50 mm in length and less than about 20 mm in width. In some embodiments, for ease of construction, spacers of equal distance to each other are attached to each bimorph under each set of end holes (first layer 115, second layer 215) in which the spacer 215 attached under the second end holes 213 is interposed between the first layer and the second layer. Each bimorph shim extends beyond the length of the top and bottom piezoelectric plates. Each shim has two ends, and both ends have a hole or holes (first layer 115, second layer 213) drilled into them that aid in securing the actuator onto the skull bone. In some embodiments, each actuator is secured to the skull bone using titanium screws screwed into the shim holes.

In some embodiments, each single-level actuator within the multi-level actuator has a similar first resonance frequency. In some embodiments, single-level actuators within the multi-level actuator have different first resonance frequencies. In a preferred embodiment, a multi-level actuator has a first layer single-level actuator having a first resonance frequency between about 400 Hz and about 1000 Hz, more preferably such that the frequency response of the actuator matches that of a bone-anchored hearing aid; and a second layer single-level actuator having a first resonance frequency higher than that of a bone-anchored hearing aid, preferably greater than about 1000 Hz, more preferably greater than that of about 1500 Hz. The distance spanned by spacers between two layers is selected to allow for the full travel of each layer. In some embodiments, the distance spanned by spacers between two layers is selected to be as small as possible without causing the layers to contact each other when in operation. In some embodiments, piezoelectric materials are electrically driven using electrical connections independently attached to the plates of each layer; see, e.g., FIG. 8B.

A single-level actuator, whether used by itself or as part of a multi-level actuator, can be designed to have a desired first resonance frequency by appropriate selection of geometry (shim length, shim width, shim thickness, piezo length, piezo width) and bimorph material (shim, piezo). In some embodiments, a bimorph has mass added to it in order to achieve a desired first resonance frequency, such as between about 400 Hz and about 1000 Hz. In some embodiments, any or all of these strategies are used to achieve to a desired first resonance frequency. In some embodiments, the piezoelectric plates are composed of Piezo Material Lead Zirconate Titanate (PZT-5H). In some embodiments, the piezoelectric plates are composed of lead magnesium niobate-lead titanate solid solution (PMN-PT). Providing two or more layers within a multi-level actuator may be desirable in order to provide a resonance profile that includes peaks at two or more first resonance frequencies. In some embodiments, the multi-level actuator has single or multiple resonance frequencies consistent with the frequency distribution of the speech spectrum, preferably at least to match the resonance frequency or frequencies of the actuator to the frequency ranges containing the most power in the speech spectrum (around 500 Hz and around 1800 Hz).

Installation of a PIHA as disclosed herein can proceed by implantation across the mastoid cavity or across a shallow recess made on the skull bone to accommodate the thickness of the piezoelectric plate closest to the skull bone (plus any spacer attached below that plate if present), or at the temporal bone or the parietal bone. In some embodiments, titanium screws are used to secure the actuator to bone. In some embodiments with added center mass, it may be necessary to create a small cavity in the bone sufficient to hold the mass. In some embodiments, the small cavity is up to 10 mm deep and 10 mm in diameter.

EXAMPLES

In simulation, the single-level and multi-level embodiments of the disclosure result in generation combined inertial and bending force at the screw/skull interface.

We fabricated single-level and multi-level actuators using PZT5H as the piezoelectric material.

Single-level actuators were constructed with piezo plates each 27.5×12.5×0.5 mm (length by width by thickness) and a shim of 40×12.5×0.25 mm for PIHA 500 1L, or 27.5×12.5×1.0 mm and 40×12.5×0.25 mm for PIHA 1000 1L; these actuators were tested as described below. Multi-level actuators were constructed using two single-level actuators of identical dimensions (either the 0.5 mm or 1.0 mm as described above for PIHA 500 2L and PIHA 1000 2L respectively). Multi-level actuators had spacers of 3 mm length attached below the end holes, such that the distance between the two shims when not in operation was 3 mm (that is, the spacer distance is measured as between the shims; the bottom piezoelectric plate of the second layer and the top piezoelectric plate of the first layer exist within the spacer distance but do not contact the spacers themselves). All of these were tested as described below. (Another single-level actuator was constructed with piezo plates each 30×20×0.5 mm and a shim of 50×20×0.25 mm, but no data is shown for this actuator.)

We tested the performance of single-level and multi-level actuators when installed in cadaver heads. Testing was performed with and without a center mass of 15 g to refine first resonance frequency of the first layer.

Promontory vibration in response to actuator simulation at 111 difference frequencies (20 frequencies per octave starting at 200 Hz) was measured using a laser Doppler vibrometer (Polytec LSV-400) and compared with promontory vibration measured in response to BAHA at similar frequencies. To enable vibration measurement the ear canal was enlarged and the cochlear promontory was exposed. A layer of reflective glass beads was glued to the exposed promontory to enhance signal to noise ratio. The data from laser Doppler vibrometer was collected using the NI data acquisition system. Python scripts were used for data analysis.

For both single-level and multi-level actuators, we observed that the efficacy of the actuator was equal to or greater than BAHA at most of the frequencies in the range of 250 to 10000 Hz.

While not wishing to be bound by any particular theory, we believe that at low frequencies the inertial force generated by the actuator results in rigid body motion of the head, similar to that observed with BAHA. Bending of the actuator would then produce inertial force on the skull and a shear force would also be generated resulting in bending waves. At high frequencies, combined inertial and bending forces could be responsible for transmission of vibration through the skull bone. While the first resonance frequency for the single-level design and the first layer of the multi-layer design were both observed in the range of 400 to 1000 Hz, for the multi-layer design the second layer had a first resonance frequency between 1500 and 2000 Hz.

The invention claimed is:

1. A piezoelectric actuator capable of being secured to bone using surgical screws, the actuator having a first layer piezoelectric bimorph, the first bimorph having a first top piezoelectric plate, a first bottom piezoelectric plate, and a first bimorph shim interposed between and approximately centered within the first piezoelectric plates, wherein the first shim has a length longer than that of the first piezoelectric plates such that first ends are formed, wherein the first ends have first holes suitable for inserting surgical screws therein, the actuator also having a second layer piezoelectric bimorph, the second bimorph having a second top piezoelectric plate, a second bottom piezoelectric plate, and a second bimorph shim interposed between and approximately centered within the second piezoelectric plates, wherein the second shim has a length longer than that of the second piezoelectric plates such that second ends are formed, wherein the second ends have first holes suitable for inserting surgical screws therein; and a spacer between the first bimorph and the second bimorph.

2. The actuator of claim 1 also having a center mass attached to the first bimorph.

3. The piezoelectric actuator of claim 1 in which the first resonance frequency of the first layer is between about 400 and about 1000 Hz.

4. The piezoelectric actuator of claim 1 in which the first resonance frequency of the first layer is between about 400 and about 1000 Hz and the first resonance frequency of the second layer is above 1000 Hz.

5. The piezoelectric actuator of claim 1 in which the piezoelectric plates are composed of PZT 5H.

6. The piezoelectric actuator of claim 1 in which the piezoelectric plates are composed of PMN-PT.

7. The piezoelectric actuator of claim 1 in which the shims do not exceed 50 mm in length.

8. The piezoelectric actuator of claim 1 in which the shims do not exceed 20 mm in width.

9. The piezoelectric actuator of claim 1 for use in a piezoelectric inertial hearing aid.

10. A kit comprising a piezoelectric inertial hearing aid having an actuator of claim 1, and a set of surgical screws, each screw of a length long enough to reach through a preselected first end hole, each spacer if present, each corresponding second end hole if present, and into bone.

* * * * *